US006291315B1

(12) United States Patent
Nakayama et al.

(10) Patent No.: US 6,291,315 B1
(45) Date of Patent: Sep. 18, 2001

(54) METHOD FOR ETCHING TRENCH IN MANUFACTURING SEMICONDUCTOR DEVICES

(75) Inventors: Yoshiaki Nakayama, Okazaki; Shoji Miura, Nukata-gun, both of (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 08/889,918

(22) Filed: Jul. 10, 1997

(30) Foreign Application Priority Data

Jul. 11, 1996 (JP) .......... 8-181884

(51) Int. Cl.[7] .......... H01L 21/304
(52) U.S. Cl. .......... 438/459; 438/425; 438/445
(58) Field of Search .......... 438/311, 359, 438/368, 410–412, 424–426, 439, 455–459, 479, 445

(56) References Cited

U.S. PATENT DOCUMENTS 4,962,056 * 10/1990 Yamaki et al. .......... 438/458
5,480,832 * 1/1996 Miura et al. .......... 438/404

* cited by examiner

*Primary Examiner*—Olik Chaudhuri
*Assistant Examiner*—Anh Duy Mai
(74) *Attorney, Agent, or Firm*—Pillsbury Winthrop LLP

(57) ABSTRACT

A semiconductor wafer in which black silicon does not form during trench etching even when side rinsing is carried out during a photolithography process. In an embedded oxide film interposed between first and second semiconductor wafers of a bonded SOI wafer, the film thickness of a peripheral part thereof is made greater than a predetermined thickness Dsio so that it functions as an oxide film for etching prevention. When side rinsing is carried out in a resist coating process to form an opening in an oxide film for masking use in trench etching, the oxide film for masking use at the periphery is also etched during formation of the opening. Due to over-etching at that time, the oxide film for etching prevention is etched by a film thickness d1. During trench etching also, the oxide film for etching prevention is etched by a film thickness d2. Accordingly, if the film thickness Dsio of the oxide film for etching prevention is set to be greater than the film thickness d1+d2, because an oxide film remains at the final stage, the formation of black silicon can be prevented.

15 Claims, 10 Drawing Sheets

26 25a 26
24 25
25
21
20

24 25 27
21
20

24 25 29
25
21
28
20

METHOD FOR ETCHING TRENCH IN MANUFACTURING SEMICONDUCTOR DEVICES

BACKGROUND OF THE INVENTION

1. Field of the Invention

This invention relates to a semiconductor wafer and a semiconductor device manufacturing method with which it is possible to prevent to the utmost the occurrence of residues such as black silicon when forming a trench for isolation/separation or for capacitor formation in a semiconductor substrate such as a silicon substrate by dry etching process.

2. Description of the Related Art

Forming trenches for device separation in a semiconductor wafer, for example a silicon wafer, has been proposed in, for example, Japanese patent application laid-open No. H.5-109882. In forming a trench, an oxide film is formed on the wafer surface by a CVD method or the like, and an opening is formed in this oxide film by photolithography process over a trench formation region. That is, the oxide film is used as an etching mask. Silicon of the trench formation region exposed by the opening in the oxide film is then selectively etched by reactive ion etching (RIE) process or the like to form a trench of, for example, about 10 to 15 μm in depth.

SUMMARY OF THE INVENTION

However, in conventional trench etching there has been the problem that there is considerable contamination due to particles. When the cause of this contamination was investigated it was found to originate in that at the time of trench etching a region where silicon is widely exposed appears at a periphery of the wafer and so-called black silicon as shown schematically in FIG. 13A is formed at this periphery. This will now be explained in more detail.

In FIG. 13A a silicon wafer to undergo trench etching is one having a so-called bonded SOI (Silicon On Insulator) structure, wherein two silicon wafers 1A, 1B are bonded together with an embedded oxide film 1C therebetween. After an oxide film 2 is formed as a mask material for trench etching on the main surface 1*a* of this silicon wafer 1, an opening for trench formation 2*a* is formed in the oxide film 2. By carrying out reactive ion etching process with the oxide film having the opening 2*a* formed therein as a mask, the exposed silicon is selectively etched to form a trench 3. When at the time of this trench etching there is a part 5 where silicon is widely exposed at the periphery of the wafer 1, black silicon 6 tends to be formed there. During subsequent processes (for example cleaning step), projecting portions of this black silicon 6 break off and become particles. It has been found that this black silicon 6 is also liable to appear in regions where the width of the trench 3 is large, as shown in the figures by the reference numeral 4.

The problem of black silicon 6 tending to be formed during trench etching is not limited to bonded SOI wafers as shown in FIG. 13A, and black silicon is also formed when a trench for device separation or a trench for capacitor formation (trench capacitor structure) is formed in a bare silicon wafer, as shown in FIG. 13B.

When black silicon 6 is formed on a silicon wafer 1 and produces particles as described above it becomes a cause of electrical insulation defects, and as a result it also has an adverse affect on manufacturing yield.

One cause of a large-area exposed silicon region 5 appearing at the periphery of the semiconductor wafer surface during trench etching is the photolithography process carried out in the process of forming the opening for trench formation 2*a* in the oxide film 2 serving as the mask material of the trench etching process.

Photolithography process consists of the steps of resist coating, exposing, developing, and etching. Among these, in resist coating, a resist material 7 such as photoresist is dripped and coated onto the silicon wafer 1 while the silicon wafer 1 is rotated at high speed by a spin coater or the like. Consequently, there arises a phenomenon in which some resist material 7 having reached the edge of the silicon wafer 1 under centrifugal force passes around from the periphery of the silicon wafer 1 to its rear side (see FIG. 14A). When resist material 7 has been coated on the periphery of the silicon wafer 1 this results in the production of particles when the wafer edge makes contact with positioning parts and the like in subsequent steps and, in other apparatus such as an exposer the occurrence of these particles causes reduction in exposure resolution, and therefore, it is necessary to remove these particles by some means.

Generally, to remove resist material 7 passing around to the edge of the silicon wafer 1, side rinsing (or edge bead removing), wherein a solvent is applied to the resist on the periphery during resist coating, has been carried out. In this process, with the silicon wafer 1 rotating, while the resist material 7 is coated by being dripped from the vicinity of the center of rotation of the silicon wafer 1, resist material 7 coated onto the periphery of the silicon wafer 1 is removed by a rinsing agent being dripped onto the periphery of the wafer (see FIGS. 14B, 14C). As a result of this the resist material 7 having passed around to the rear side is also peeled off at the same time, and consequently it is possible to avoid the problem described above. There are also such methods as backside rinsing, wherein similarly during resist coating or immediately after resist coating a rinsing liquid is applied to the rear side of the wafer to remove resist adhering to the rear side, and peripheral exposure (optical edge bead removing), wherein the wafer periphery is selectively exposed and resist on the periphery is removed during developing, but these are both for preventing particle formation originating in resist chipping at the periphery.

Therefore, in the photolithography process carried out when forming the opening 2*a* in the oxide film 2 for use as a mask during trench etching, the oxide film 2 at the periphery of the silicon wafer 1 from which the resist material 7 was removed by the above-mentioned side rinsing is also removed by the etching. As a result, during the trench etching, a region where the silicon is widely exposed appears at the periphery of the silicon wafer 1 and the above-mentioned black silicon is formed.

It is therefore an object of the present invention to provide a semiconductor wafer and a semiconductor device manufacturing method with which it is possible to prevent the formation of black silicon in the trench etching process even in a case where side rinsing is carried out before the forming of the opening for trench formation in the mask material for trench etching.

To solve the problem described above, in the present invention, in a semiconductor wafer in which a trench is formed by dry etching, semiconductor regions other than a trench formation region is prevented from exposing during trench etching.

More specifically, an oxide film of a film thickness thicker than a film thickness of an oxide film etched by dry etching to form a trench (deep groove or deep hole) in a chip formation region of a semiconductor wafer is formed in a peripheral region of the semiconductor wafer before the dry etching is carried out.

That is, because a thick oxide film is formed in the peripheral region of the semiconductor wafer in advance, this thick oxide film functions as an insulating film for etching prevention when the trench (deep groove or deep hole) is being formed. Therefore, even in a case where side rinsing is carried out when the opening for forming the trench in the mask material (oxide film) for trench etching is formed, in the main surface of the semiconductor wafer there are no parts where a semiconductor region is exposed except the opening for trench formation in the insulating film for mask use formed in the chip formation region. Also, even if the thick oxide film disposed at the periphery of the wafer is exposed at the wafer surface by the above-mentioned side rinsing, because its film thickness is set thicker than the oxide film thickness that can be etched in the trench etching, in the peripheral region of the wafer this oxide film remains after the completion of the trench etching. In other words, when trench etching is carried out, the semiconductor is not etched over a wide region other than the trench formation region, and the formation of residues such as black silicon is suppressed.

The minimum value of the film thickness of the thick oxide film formed in the peripheral region can be set on the basis of the product of the trench depth of the semiconductor and the etching selectivity of the oxide film with respect to the semiconductor at the time of trench etching, and can be set further allowing for an anticipated amount of over-etching at the time of patterning of the insulating film for use as a mask (formation of the opening for forming the trench). By setting the thickness of the thick oxide film, that is, the insulating film for etching prevention, in this way, it is possible to ensure that an insulating film for etching prevention remains after the trench is formed and the formation of residues such as black silicon can thereby be certainly prevented.

Even if semiconductor is exposed in a region other than the trench formation region at the time of trench etching, if the size of this exposed region is set so that it is narrower than the width dimension of the opening for forming the trench, an effect of suppressing the formation of residues such as black silicon can still be expected.

When the present invention is applied to a so-called SOI wafer formed by bonding two semiconductor wafers together, it is possible to utilize the embedded oxide film sandwiched between the two semiconductor wafers as an insulating film for etching prevention. Also, it is possible to oxidize the SOI wafer after the two semiconductor wafers are bonded so as to form a thick oxide film selectively at its periphery and use this as an insulating film for etching prevention.

Also, if the width dimension of the trench formation opening in the insulating film for mask use formed on the semiconductor wafer is set to 10 μm or less, residues such as black silicon can also be prevented from forming in the trench region.

DETAILED DESCRIPTION OF THE PREFERRED EMBODIMENTS

A first preferred embodiment of the present invention, wherein a bonded SOI wafer is used as a semiconductor wafer, will now be described with reference to FIG. 1A through FIG. 3.

Figure 1A:
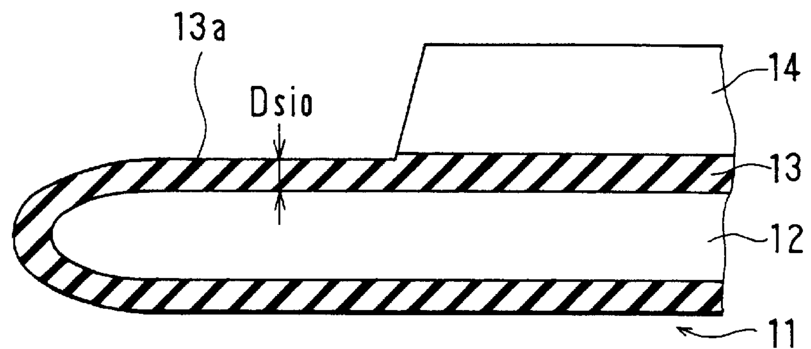
FIGS. 1A through 1C and FIGS. 2A and 2B are schematic sectional side views of a silicon wafer in respective manufacturing steps according to a first preferred embodiment of the present invention.

When semiconductor devices are formed to be isolated from each other on a silicon substrate, trenches for device separation are formed in the silicon wafer before the semiconductor devices are formed in device formation regions. In this case, as the silicon wafer, a bonded SOI (Silicon On Insulator) wafer 11 as shown in schematic sectional view of FIG. 1A is used. This SOI wafer 11 is made up of a first silicon wafer 12, an embedded oxide film 13 consisting of a thermal oxide film formed on the surface of this first silicon wafer 12 and embedded inside the SOI wafer, and a second silicon wafer 14 bonded to a main surface side of this SOI wafer 11 with the embedded oxide film 13 therebetween.

In this case, the part of the embedded oxide film 13 located at the periphery of the first silicon wafer 12 functions as an oxide film for etching prevention 13*a* constituting an insulating film for etching prevention of the present invention. The film thickness Dsio of this oxide film for etching prevention 13*a* part is set according to factors such as the conditions of a trench etching process which will be further discussed later in a range of, for example, about 0.8 to 1.1 μm and preferably about 0.9 to 1.0 μm.

Among ordinary SOI wafers, there are those wherein the film thickness of the part of the embedded oxide film 13 on the first silicon wafer 12 that is located at the interface with the second silicon wafer 14 is about 0.9 to 1.0 μm. However, due to problems associated with the manufacture of SOI wafers which will be further discussed later, in practice the film thickness Dsio of the peripheral part is several tens of percent thinner than this and is about 0.4 to 0.5 μm. Because the film thickness Dsio at the periphery is insufficient with this thickness dimension, in this preferred embodiment the film thickness of the embedded oxide film 13 is set to, for example, about 1.2 μm so that the film thickness Dsio of the oxide film 13*a* at the periphery is a thickness of about 0.9 to 1.0 μm so as to function as an oxide film for etching prevention as will be further discussed later.

By this setting, even after going through an oxide film etching step (third step) and a trench etching step (fifth step), which will be further discussed later, the silicon underneath is not exposed. As a result, it does not happen that during trench etching silicon is exposed and etching progresses over a wide area (particularly at the wafer periphery), and therefore, the formation of black silicon can be suppressed.

Next, details of steps for forming a trench for device separation will be described with reference to FIGS. 1A through 1C and FIGS. 2A and 2B. In this case, as the semiconductor wafer, the SOI wafer 11 described above (see FIG. 1A) is used.

Figure 1B:
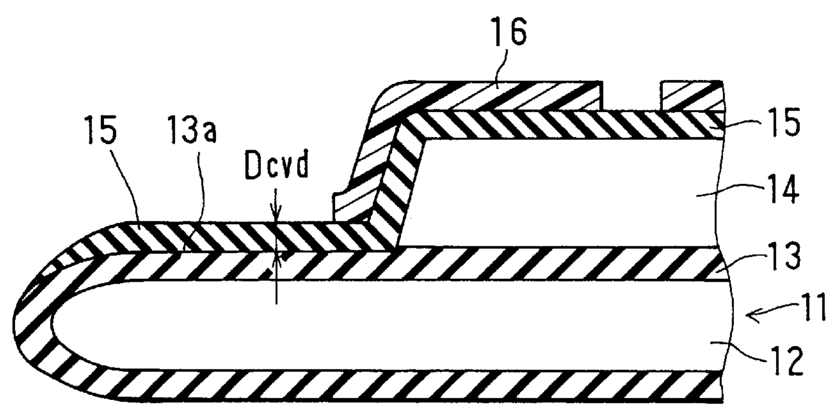

As a first step, as shown in FIG. 1B, an oxide film for masking 15 constituting an insulating film for use as a mask is deposited by a method such as a CVD method on the upper face side of the SOI wafer 11, i.e., on a face of the side on which the second silicon wafer 14 lies. Because when the oxide film for masking is formed by thermal oxidation the thickness of the oxide film 15 formed on the surface of the wafer periphery where the oxide film for etching prevention 13*a* is exposed, becomes insufficient, it is necessary to make the oxide film for masking 15 by a deposited film of the kind obtained by the CVD method. Also, the film thickness Dcvd of the oxide film for masking 15 is set to about 1.0 μm. The value of this film thickness is set so as to be amply thicker than the small thickness of the oxide film which is etched along with the silicon in a trench etching step which will be further discussed later. At the periphery of the SOI wafer 11 the underlying embedded oxide film 13 is used as the oxide film for etching prevention 13*a* and the oxide film for masking 15 on top of this are laminated and therefore, at this part the film thickness of the whole as an oxide film is about 2.0 μm.

Then, as a second step, photoresist 16, which is a resist material, is coated onto the side of the SOI wafer 11 on which the oxide film for masking 15 is formed, and is patterned by photolithography process. Coating of the photoresist 16 is carried out by dripping a liquid photoresist 16 and coating it over the entire surface of the SOI wafer 11 in an ordinary spin coater. However, during this coating or immediately after coating, photoresist 16 remaining at the periphery is removed by the above-mentioned side rinse process.

In side rinsing, developing liquid is dripped onto the peripheral portion of the photoresist 16 immediately after coating and this photoresist 16 is rinsed off. As a result, photoresist 16 passing around from the periphery to the rear side is removed and improvement of the processing accuracy in subsequent steps is thereby promoted. Therefore, as a result of going through this side rinse process, the oxide film for etching prevention 13*a* at the periphery of the SOI wafer 11 becomes partially exposed. In the positional relationship between the end of the photoresist 16 and the end of the second silicon wafer 14 at this time, the latter must is on the inner side in the face of the wafer. This is to prevent a silicon surface from being exposed from the end face of the second silicon wafer 14 after patterning of the oxide film for masking 15, which will be further discussed later.

Then, by carrying out exposure using a mask corresponding to the parts on which trench etching is to be carried out and developing the photoresist 16, as shown in FIG. 1B, a predetermined pattern is formed in the photoresist 16. The pattern of the photoresist 16 thus formed is for forming an opening 15*a* in the oxide film for masking 15 in the next step.

Figure 1C:
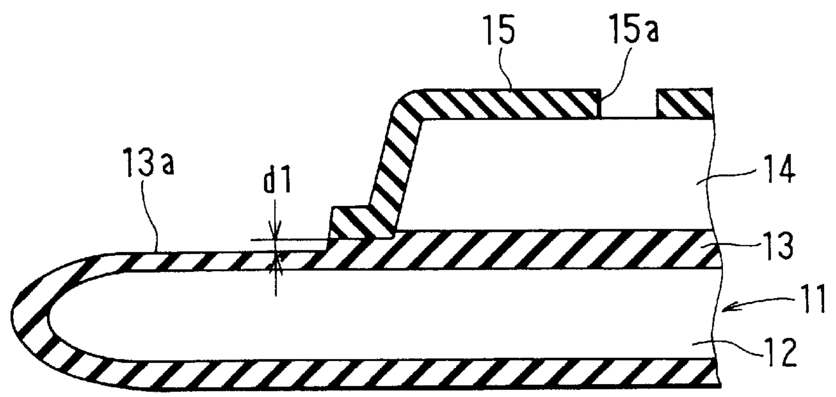

Next, as a third step, by carrying out dry etching on the oxide film for masking 15 using a mixed gas of $CF_4$, $CHF_3$ and Ar or the like, as shown in FIG. 1C, an opening 15*a* is formed in a region where a trench is to be formed. The width dimension of the opening 15*a* at this time is set to be no greater than, for example, 10 μm. This is because the width dimension of the opening being larger can be expected to result in the formation of black silicon, as will be further discussed later. Also, in this dry etching, to certainly remove the part of the oxide film for masking 15 corresponding to the opening 15*a*, generally, with respect to the film thickness Dcvd of the oxide film for masking 15 being etched, conditions providing over-etching of about 30% are set.

Therefore, in the dry etching of this oxide film for masking 15, not only the part of the oxide film for masking 15 where the photoresist 16 was removed by side rinsing at the periphery of the SOI wafer 11 is removed by etching at the same time, but also the underlying oxide film for etching prevention 13*a* is etched by a thickness d1 due to the above-mentioned over-etching. In this case, because the film thickness of the oxide film for etching prevention 13*a* was set to about 0.9 to 1.0 μm as mentioned above, even after the over-etching about 0.7 μm remains.

After the patterning of the oxide film for masking 15, as a fourth step, the photoresist 16 remaining on the SOI wafer 11 is removed (see FIG. 1C). As a result, on the SOI wafer 11 there is just the oxide film for masking 15 having the opening 15*a* formed therein. Also, at the periphery of the SOI wafer 11, although the oxide film for masking 15 has been removed by etching, the oxide film for etching prevention 13*a* formed as its underlying film remains and still covers the surface of the first silicon wafer 12.

Figure 2A:
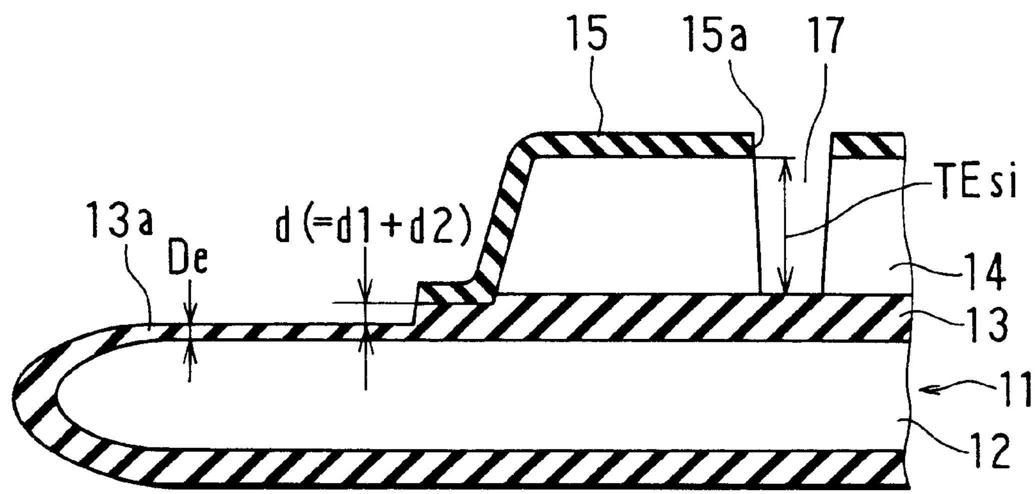

Then, as a fifth step, by a reactive ion etching (RIE) process using a reaction gas consisting of a mixed gas of HBr, $SiF_4$, $SF_6$ and $He/O_2$ or the like, as shown in FIG. 2A, the silicon exposed in the opening 15*a* formed in the oxide film for masking 15 is selectively dry etched (trench etched). In this reactive ion etching process, the etching selectivity of the silicon with respect to the oxide film is set at about 50:1. Consequently, when the silicon is etched by the amount of the thickness (TEsi) of the second silicon wafer 14, i.e. up to a depth dimension of about 15 μm, to form a trench 17, although only slightly, the oxide film for masking 15 and the oxide film for etching prevention 13*a* at the periphery are etched also.

Figure 2B:
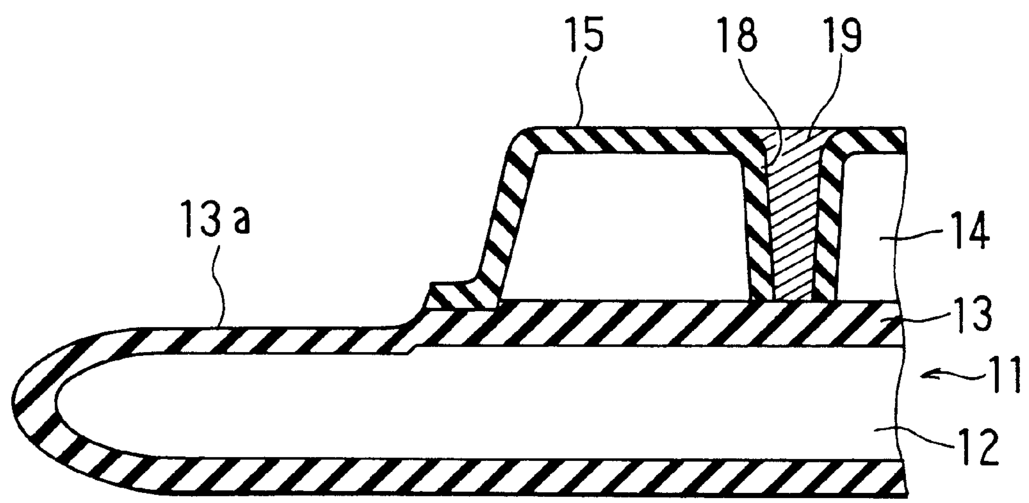

Then, after reaction products accumulated on the side walls of the inside of the trench are removed using an etchant such as HF, thermal oxidation is carried out to form an oxide film 18 on the silicon surface inside the trench 17. Polysilicon 19 is then deposited by a method such as an LPCVD (Low Pressure CVD) method so as to fill in the trench 17 and polysilicon deposited on parts other than the trench 17 (on the wafer surface) is etched back by dry etching, whereby the trench is filled in as shown in FIG. 2B.

Through these steps, multiple island-shaped silicon regions insulated and separated from each other are formed in the chip formation region of the SOI wafer 11. Semiconductor devices are formed in these island-shaped silicon regions, respectively. In the description above, steps of the present preferred embodiment were described in outline, focusing on the periphery of the SOI wafer; details of trench etching in the chip formation region and semiconductor device formation processes and so on can be found, for example, in Japanese patent application laid-open No. H.5-109882.

As described above, in this preferred embodiment, because the film thickness Dsio of the oxide film for etching prevention 13*a* at the wafer periphery is set so that during reactive ion etching process for the silicon no silicon is exposed in a region other than the trench formation region, and also, the opening width of the trench formation region is set not to exceed 10 $\mu$m, any formation of black silicon is ceased. As a result, projecting portions of black silicon breaking off and becoming particles in subsequent steps can be prevented, processing can be carried out with high accuracy, and it is also possible to contribute to yield improvement.

Next, the causes of black silicon tending to be formed when silicon has become exposed over a large area during trench etching will be explained.

Figure 13A:
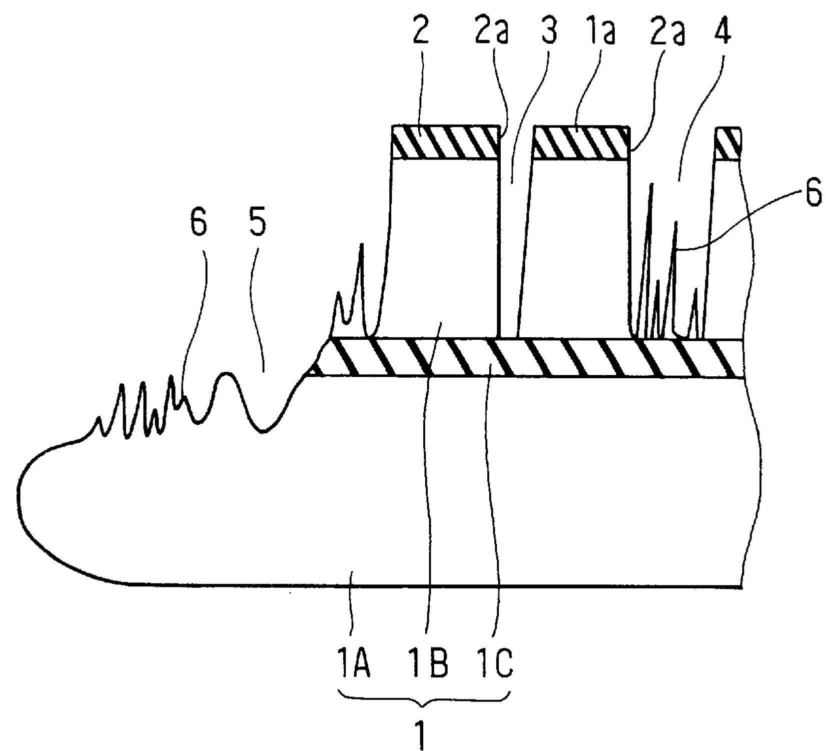
FIGS. 13A and 13B are schematic sectional side views of the edge of a wafer showing black silicon forming during trench etching.
Figure 13B:
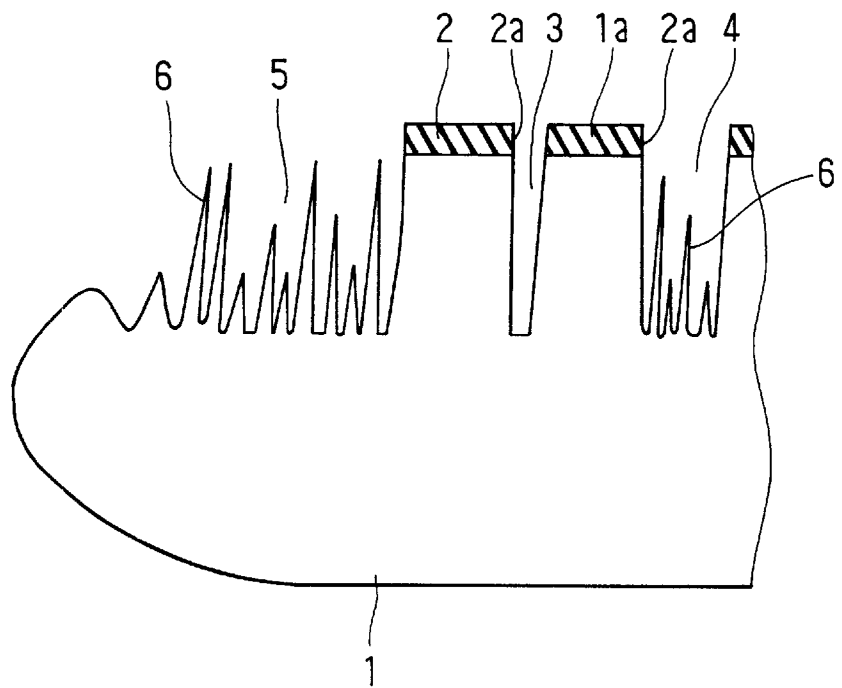
Figure 14A:
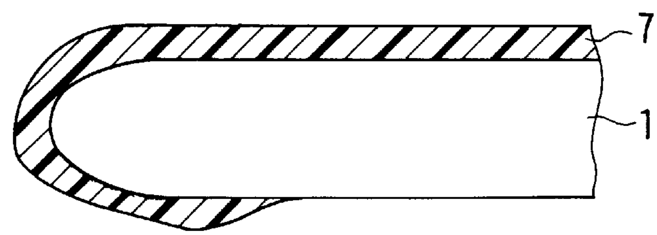
FIGS. 14A and 14B are schematic sectional side views.
Figure 14B:
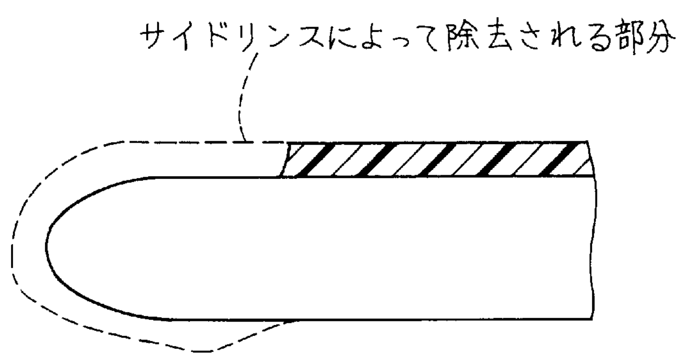
Figure 14C:
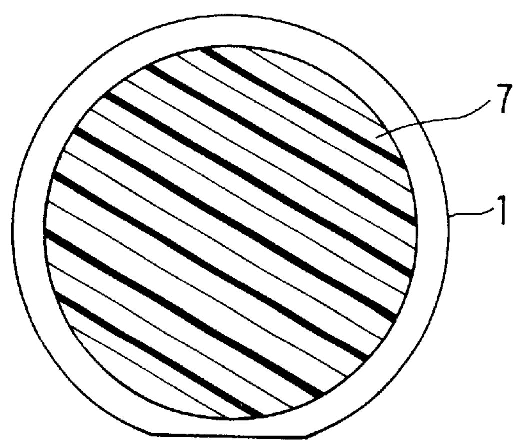
FIG. 14C is a plan view of a wafer illustrating side rinsing.

As mentioned above, as the etching mask for trench etching, an oxide film is usually used so that etch selectivity can be obtained in the silicon constituting the material being etched. Also, so that the etch selectivity of the silicon at the time of trench etching is high, the reactive dry etching process is employed. The etching chemistry of reactive dry etching is thought to be that the reaction gas is fed onto the wafer in a plasma state, ions in the plasma are accelerated by an electric field and collide with the wafer surface, Si exposed at the wafer surface bonds with F to form highly volatile Si—F, and Si—F evaporates, whereby etching proceeds. Here, it is thought that Br has an effect of damaging the Si surface and promoting the production of Si—F. Naturally this evaporation of Si—F also occurs at the oxide film surface, but compared to the reaction at the Si surface this evaporation is slow, and therefore the etching rate of the oxide film surface is low. On the other hand, when a large quantity of oxygen is supplied in the reaction gas, volatilized Si—F reacts with oxygen molecules and Si—O is produced; this accumulates on the wafer surface (on the oxide film for masking) and the trench side walls so as to makes it possible to obstruct the progress of etching in a side wall direction and suppress the rate at which the oxide film for masking erodes, and as a result it is possible to obtain a large etching selectivity of the silicon with respect to the oxide film. However, when the etching selectivity of the silicon is set high, in other words when the supplied amount of oxygen is increased to increase the rate of accumulation of Si—O, because particularly in places where large areas of silicon are exposed the density of Si—F in the gas phase is also high, the reaction producing of Si—O becomes excess and the probability of Si—O re-adhering to the silicon which is the surface to be etched rises. When this phenomenon happens, the adhered reaction product acts as a mask material against the etching, and consequently etching proceeds other than a region where the reaction product is adhered. When these re-adhered regions become excess, fine silicon projections are formed on the etching surface as a whole, and these constitute so-called black silicon as shown schematically in FIGS. 13A and 13B.

Although it is conceivable to set the etching selectivity to a low level at which black silicon is not formed by controlling the supplied amounts of oxygen and fluorine, in this case the trench side surface protection provided by the reaction product Si—O is also suppressed, and a state called bowing, wherein the cross-sectional shape of the trench becomes a shape swollen in the middle, arises, and as a result of this there is the problem that when in a later step the trench is filled with polysilicon or the like, a hollow part constituting a so-called 'cavity' is formed. Consequently, it is not possible to simply reduce the etching selectivity.

Therefore, to suppress the formation of pillar-like residues such as black silicon, as is done in the present preferred embodiment it is effective to set the film thickness Dsio of the oxide film for etching prevention 13*a* so that silicon is not widely exposed in regions other than the trench formation region during trench etching (particularly at the wafer periphery), or if silicon does become exposed the size of the exposed region is set so that it is narrower than the width of the opening 15*a* for forming the trench.

Figure 3:
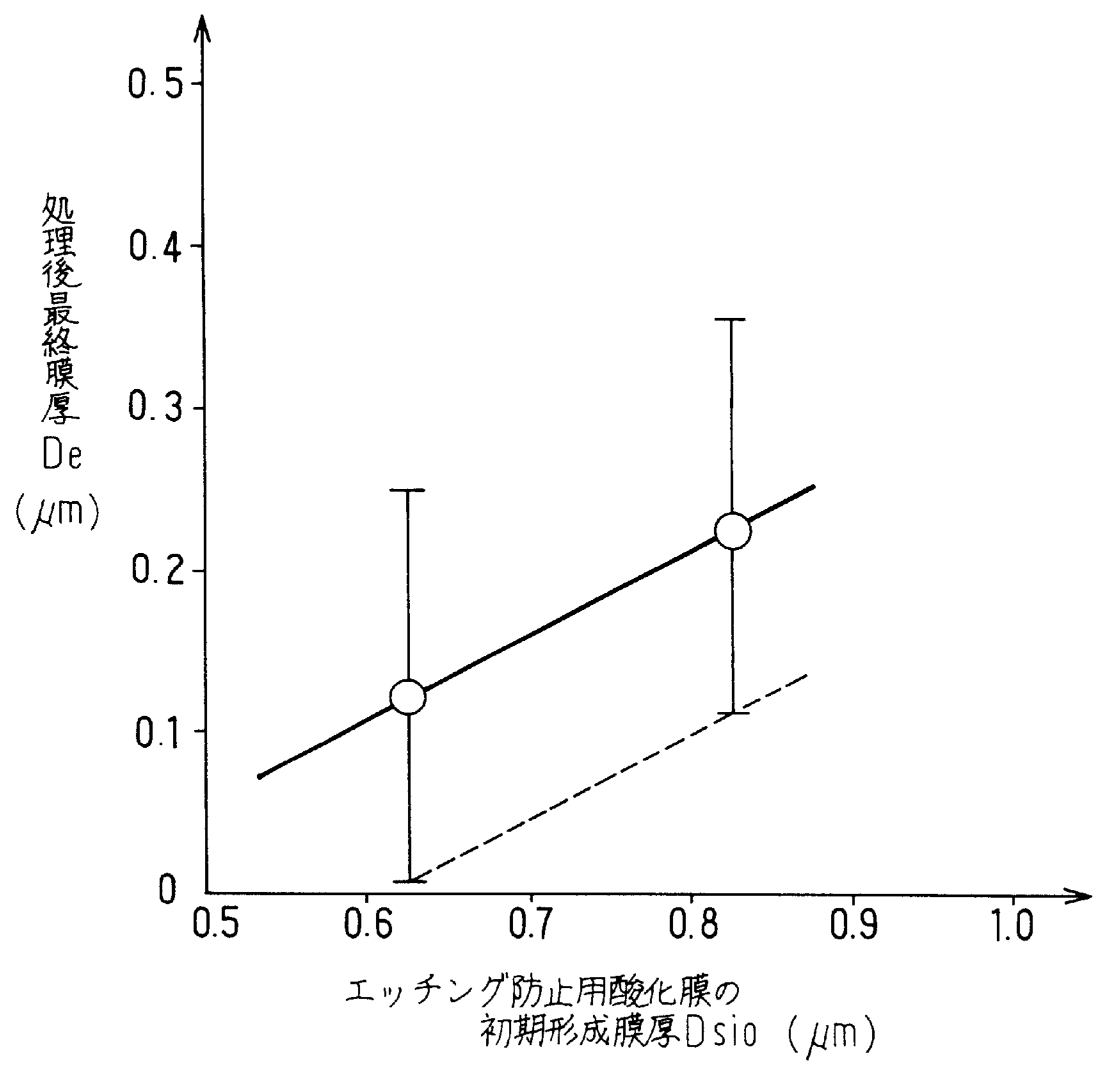
FIG. 3 is a graph showing the correlation between the initial film thickness and the final film thickness of an oxide film for etching prevention.

By experiment the present inventors have ascertained to what level the film thickness Dsio should be set when an oxide film for etching prevention 13*a* is formed as described above. FIG. 3 shows this result. In this experiment, for the film thickness Dsio of an oxide film for etching prevention to be made to remain on the periphery of a silicon wafer, the correlation of what level the film thickness De of the oxide film finally remaining at the periphery of the wafer becomes as a result of carrying out trench etching was ascertained.

In this case, the experiment conditions for the various parts were set as follows:

film thickness Dcvd of oxide film for masking (formed by CVD)=1.5 $\mu$m silicon etching depth TEsi=15 $\mu$m etch selectivity k of silicon to oxide film=50 to 200 amount of over-etching on patterning of oxide film for masking=+30%

As a result, it was found that, under these conditions, a film thickness Dsio of the oxide film for etching prevention of 0.63 $\mu$m at the minimum is necessary, and that with the about 0.4 to 0.5 $\mu$m of when the present preferred embodiment is not applied the underlying silicon is liable to become exposed during trench etching. Also, it was ascertained that it is sufficient to allow for a variation of film thickness of about 0.3 $\mu$m over the wafer surface originating in process dispersion.

In view of the above results, the necessary film thickness Dsio of the oxide film for etching prevention will now be estimated. First, considering an actual etching process, satisfying the following Exp. (1) is a condition:

$$De=(Dcvd+Dsio)-(Dcvd+d1+d2)>0 \quad (1)$$

where De is the film thickness of the oxide film for etching prevention finally remaining, Dsio is the film thickness of the oxide film for etching prevention, Dcvd is the film thickness of the oxide film for masking, d1 is the film thickness of the oxide film for etching prevention that is etched in the dry etching process for the oxide film for masking 15, and d2 is the film thickness of the oxide film for etching prevention that is etched in the trench etching process.

Finding from Exp. (1) the value required of the film thickness Dsio of the oxide film for etching prevention, Exp. (2) is obtained:

$$Dsio>d(=d1+d2) \quad (2)$$

Accordingly, the dimension d controlling the film thickness Dsio will now be found. The dimensions shown in Exp. (2) have the following relationships, respectively:

$$d1=0.3\times Dcvd \quad (3)$$

$$d2=TEsi/k \quad (4)$$

$$Dcvd=0.1\times TEsi \quad (5)$$

where TEsi is the depth of silicon etched in the trench etching process and k is the etching selectivity of the silicon to the oxide film at the time of the trench etching and is defined as (TEsi/TEsio)=(50 to 200). In Exp. (5), so that the oxide film for masking certainly remains on the silicon wafer surface at the time of trench etching, its film thickness Dcvd is set at an estimated thickness corresponding to 10% of the silicon trench depth TEsi, but alternatively its minimum value can be set using the trench depth TEsi and the etching selectivity k.

Accordingly, substituting the relationships of Exps. (3) through (5) into Exp. (2) to find the value of d, Exp. (6) is obtained:

$$d=(0.03+1/k)\times TEsi=(0.035 \text{ to } 0.05)\times TEsi \quad (6)$$

When a value is calculated for a case where from the above-mentioned result the dimension TEsi is made to 15 $\mu$m, from Exp. (6), d becomes a dimension between 0.525 $\mu$m and 0.75 $\mu$m. From this, it can be seen that a value roughly agreeing with the experimental result is obtained. Next, a practical value of Dsio satisfying the relationship of Exp. (2) will be estimated. Supposing that the oxide film for etching prevention 13*a* is formed allowing a thickness of 0.3 $\mu$m to take into account the above-mentioned dispersion in manufacturing steps, it is found that in this case a preferable film thickness Dsio of the oxide film for etching prevention 13*a* is about 0.8 $\mu$m to 1.1 $\mu$m.

That is, it is on the basis of the above-mentioned reasons that the film thickness of the oxide film for etching prevention 13*a* was set to about 0.9 to 1.0 $\mu$m (0.8 to 1.1 $\mu$m) as described in this preferred embodiment. If the film formation accuracy in manufacturing steps is better the film thickness Dsio of the oxide film for etching prevention 13*a* may be set to a thinner dimension than the dimension d mentioned above, and of course reversely it may be set to a thicker dimension than the estimated film thickness Dsio (=0.8 to 1.1 $\mu$m).

In this first preferred embodiment, the film thickness of the embedded oxide film is controlled according to the thickness of the second silicon wafer constituting the device formation side, i.e. the depth TEsi to be trench-etched, so that the oxide film thickness Dsio at the wafer periphery is a film thickness such that an oxide film still remains after the trench etching. This point will now be discussed in more detail.

Here, the method by which the bonded SOI wafer 11 is manufactured will be briefly described, using FIG. 4A through FIG. 4G. First, a thermal oxide film to become the embedded oxide film 13 is formed on the surface of the first silicon wafer 12 to constitute the base, and the second silicon wafer 14 to become the device formation side is prepared (see FIG. 4A); mirror faces of these are then fixed together in a clean atmosphere by a known direct bonding method and bonded by annealing (see FIG. 4B). The second silicon wafer 14 is then thinned by grinding from its obverse side (see FIG. 4C), and its peripheral part 14A is ground to prevent edge chipping (see FIG. 4D). After that, with masking tapes 100*a*, 100*b* affixed to the upper and rear sides of the bonded wafer (see FIG. 4E), the periphery of the second silicon wafer 14 is removed by wet etching with a chemical liquid (see FIG. 4F). The masking tapes 100*a*, 100*b* are then peeled off and polishing for finishing is carried out on the surface of the second silicon wafer 14 (see FIG. 4G) to obtain a bonded SOI wafer 11 having a SOI layer of the desired thickness (TEsi).

In the course of this manufacturing process, as described above the oxide film thickness Dsio at the periphery of the wafer becomes several tens of percent thinner than the film thickness of the embedded oxide film in the middle of the wafer. That is, as shown in FIG. 5, the film thickness of the oxide film 13 formed on the peripheral surface the first silicon wafer 12 becomes thinner than the film thickness in the region where the second silicon wafer 14 lies on the surface of the oxide film 13 (TA<Tsio) and becomes still thinner for approaching the edge of the first silicon wafer 12 (TB<TA). This is a result of the wet etching of the wafer edge in the step illustrated in FIG. 4F and also of over-etching being carried out at that time in order to completely remove the silicon from the peripheral surface.

Figure 4A:
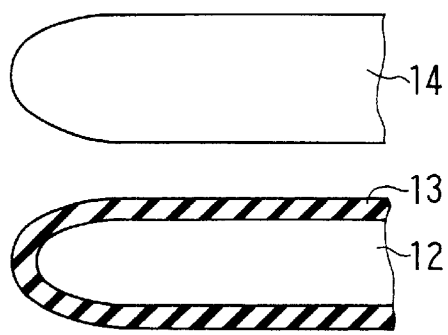
FIGS. 4A through 4G are schematic sectional side views of a wafer in respective manufacturing steps for a laminated SOI wafer.
Figure 4E:
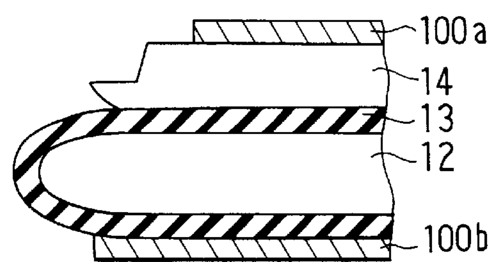
Figure 4B:
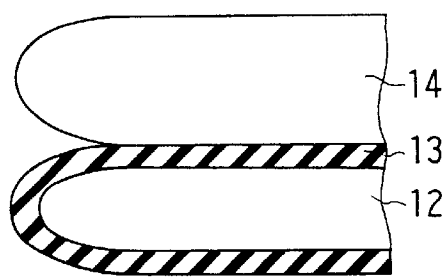
Figure 4F:
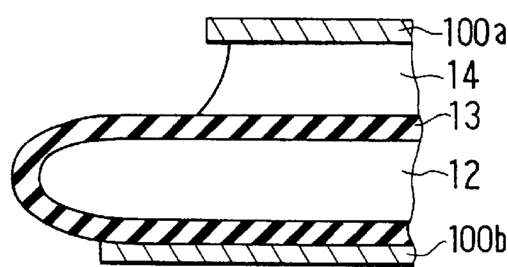
Figure 5:
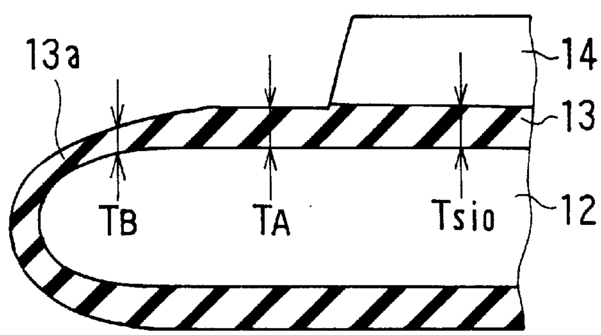
FIG. 5 is a schematic sectional side view of a wafer illustrating a film thickness distribution of an oxide film at the wafer edge.
Figure 6:
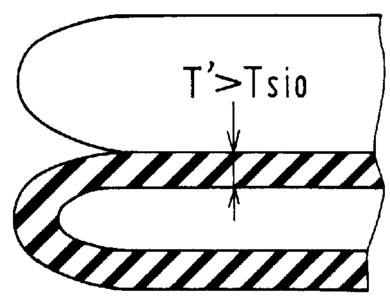
FIG. 6 is a schematic sectional side view of a wafer showing a characteristic part in manufacturing of the laminated SOI wafer in the first preferred embodiment.

In the first preferred embodiment described above, to make it possible to secure the film thickness Dsio (0.8 to 1.1 $\mu$m) necessary to make the oxide film at the periphery function as an oxide film for etching prevention 13*a*, the film thickness of the embedded oxide film 13, i.e. the film thickness of the thermal oxide film before bonding of the wafer, is made thick (T'>Tsio), at about 1.2 $\mu$m, as shown in FIG. 6, to allow for an amount of etching in this wet etching (the step illustrated in FIG. 4F).

Figure 4C:
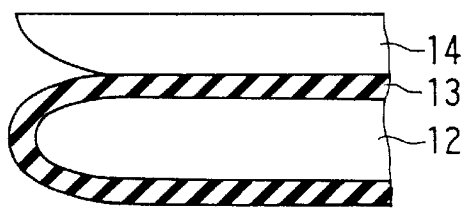
Figure 4G:
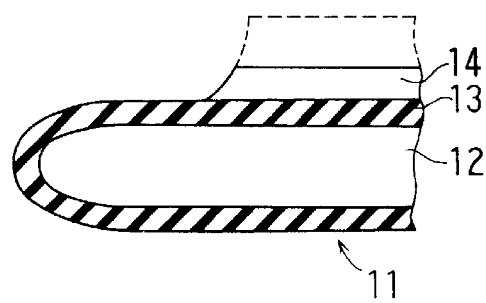
Figure 4D:
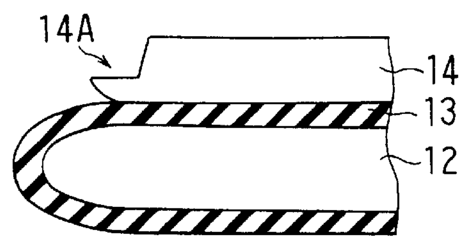
Figure 7A:
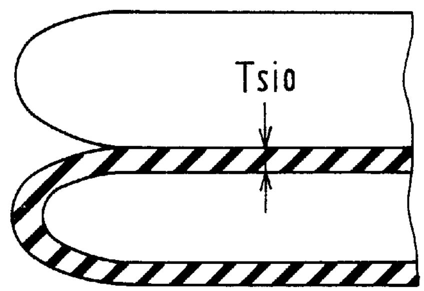
FIGS. 7A and 7B are schematic sectional side views of a wafer showing characteristic parts in manufacturing of a laminated SOI wafer according to a modified version of the first preferred embodiment.
Figure 7B:
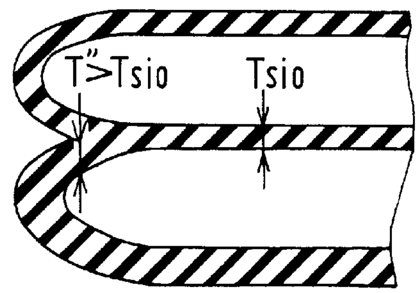
Figure 8A:
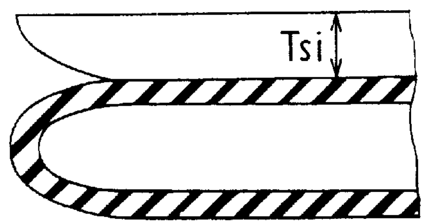
FIGS. 8A and 8B are schematic sectional side views of a wafer showing characteristic parts in manufacturing of a laminated SOI wafer according to a modified version of the first preferred embodiment.
Figure 8B:
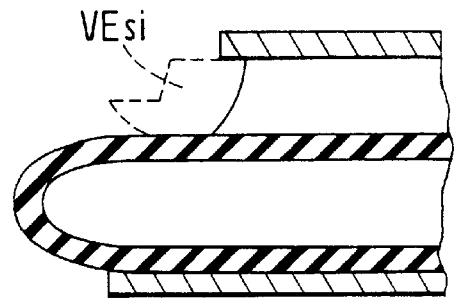

As alternatives to this, to make it possible to secure the film thickness Dsio necessary for making the oxide film at the periphery function as an oxide film for etching prevention 13*a* it is possible to employ methods such as selectively increasing the oxide film thickness at the wafer periphery from Tsio to T" by changing the annealing process following the bonding step of FIG. 4B from annealing in an inert atmosphere to annealing in an oxidizing atmosphere (see FIGS. 7A and 7B) or increasing the amount of grinding in the grinding step of FIG. 4C (make Tsi thinner) and reducing the etching amount VEsi at the wafer periphery in the wet etching step of FIG. 4F (see FIGS. 8A and 8B).

Also, although the method shown in FIG. 6 of increasing the thickness of the oxide film before bonding as described in the first preferred embodiment is the most effective, considering factors such that there is the problem that about 1.3 $\mu$m is the limit of the thickness of oxide film that can be formed by thermal oxidation, with thicknesses greater than this a throughput is low, although forming an oxide film on the second silicon wafer is conceivable the bonding of oxide films to each other is inferior, even when the oxide films are not thermal oxide films but rather are deposited by the CVD method the bonding is still not good, and further, making the oxide film thicker reduces heat radiation performance, it may be preferable to make the film thickness of the oxide film as thick as is possible by the method shown in FIG. 6 and combine the methods shown in FIGS. 7A, 7B, 8A and 8B to obtain a method of manufacturing the bonded SOI wafer 11 such that it is possible to secure the film thickness Dsio necessary for the oxide film at the wafer periphery to function as an oxide film for etching prevention 13*a*.

Next, a second preferred embodiment of the invention will be described using FIG. 9A through FIG. 12C. In this second preferred embodiment, an ordinary bare silicon wafer 20 is used instead of the SOI wafer 11. That is, this preferred embodiment relates to a case wherein trenches for isolation/separation or capacitor formation are to be formed in the silicon wafer 20. This second preferred embodiment will be described in accordance with the manufacturing steps illustrated in the figures.

Figure 9A:
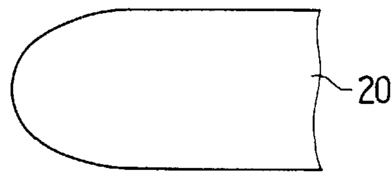
FIGS. 9A through 9D are schematic sectional side views of a silicon wafer in respective manufacturing steps of a second preferred embodiment of the present invention.
Figure 9B:
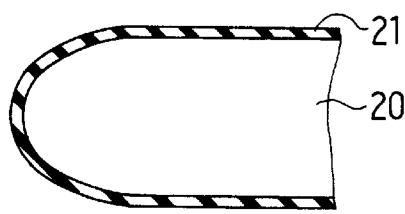
Figure 9C:
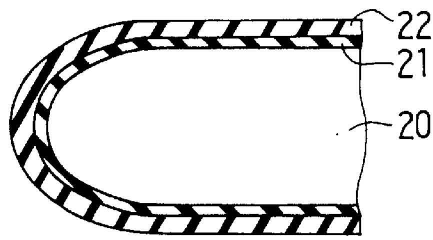
Figure 9D:
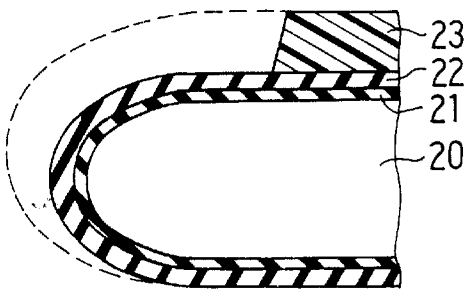
Figure 10A:
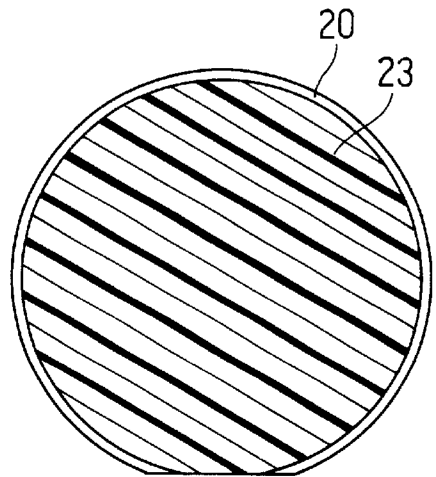
FIGS. 10A and 10B are schematic plan views of a silicon wafer in the step of the second preferred embodiment shown in FIG. 9D.
Figure 10B:
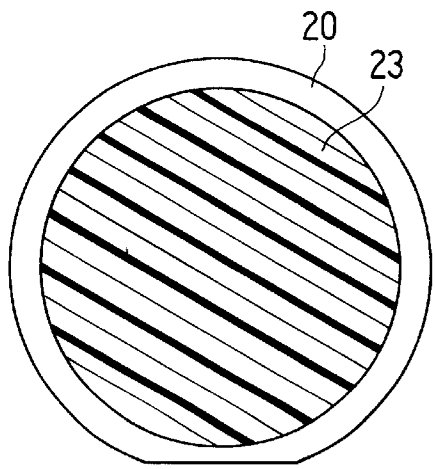

First, a thin pad oxide film 21 is formed on the surface of the ordinary silicon wafer 20 shown in FIG. 9A by a CVD method, thermal oxidation or the like (see FIG. 9B). This pad oxide film 21 is formed to prevent defects caused by stress from a silicon nitride film formed next. As shown in FIG. 9C, a silicon nitride film 22 is formed on the pad oxide film 21 to a predetermined thickness by an LPCVD method or the like. This silicon nitride film 22 is used as a mask in a LOCOS process of a later step. Then, using an ordinary spin coater or the like, a photoresist 23 is coated onto the wafer surface and the above-mentioned side rinsing, peripheral exposure and developing are carried out, whereby the photoresist 23 on the wafer periphery is removed, as shown in FIG. 9D. In the step shown in this FIG. 9D, first, in the side rinse process, the photoresist coated on the outer approximately 3 mm of the wafer periphery and photoresist having passed around to the rear side is removed as shown in FIG. 10A by spraying with a rinsing liquid, and then by peripheral exposure the photoresist 23 at the wafer periphery including the orientation flat part of the wafer is removed at the time of developing, as shown in FIG. 10B. The silicon nitride film 22 exposed at the periphery is then removed by dry etching (see FIG. 11A).

Figure 11A:
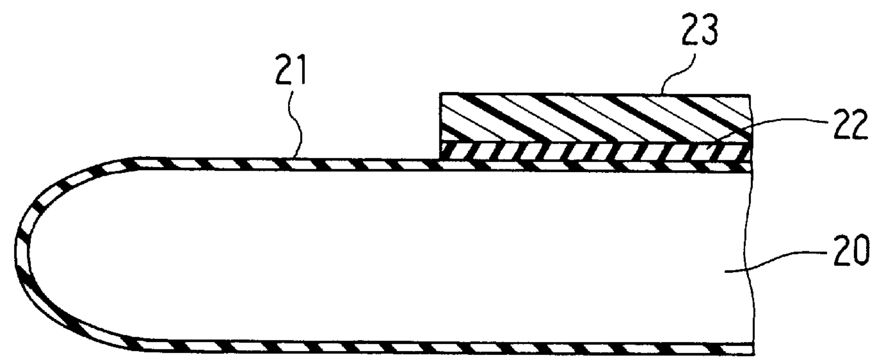
FIGS. 11A through 11C and FIGS. 12A through 12C are schematic sectional side views of a semiconductor wafer in respective steps of the second preferred embodiment of the present invention.
Figure 11B:
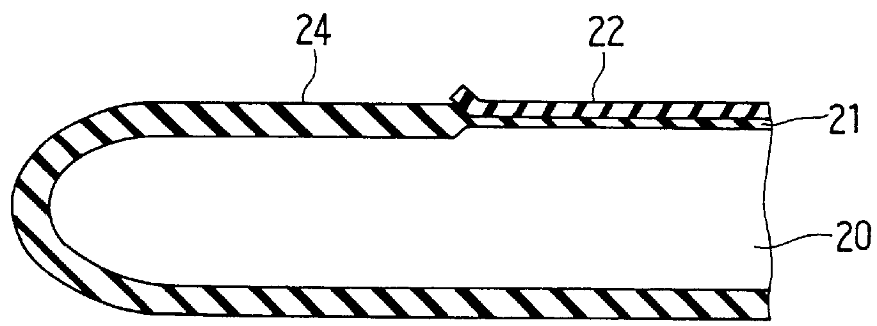

After the photoresist 23 is removed, by carrying out oxidation with the silicon nitride film 22 disposed except the periphery of the silicon wafer 20 as a mask (LOCOS step), an oxide film for etching prevention 24 is formed to a thickness of about 0.9 to 1.0 μm (about 0.8 to 1.1 μm) (see FIG. 11B). After that, the silicon nitride film 22 utilized as a mask is removed by etching.

Figure 11C:
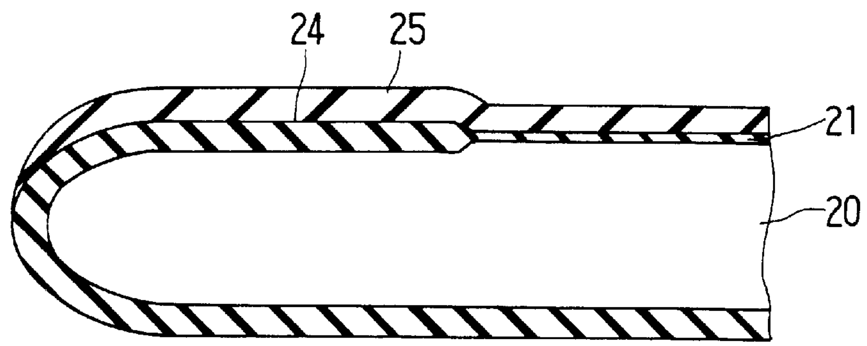

Next, as a first step, an oxide film for masking 25 is formed over the entire surface of the silicon wafer 20 by the CVD method or the like (see FIG. 11C). The film thickness of the oxide film for masking 25 is set at about 1.0 μm, as in the first preferred embodiment described above, in consideration of the trench depth. The oxide film for etching prevention 24 and the pad oxide film 21 having different thicknesses are formed on the surface of the silicon wafer 20 so as to cover the entire surface, and the boundary therebetween has a step due to the difference in film thickness, as shown in the figures.

Figure 12A:
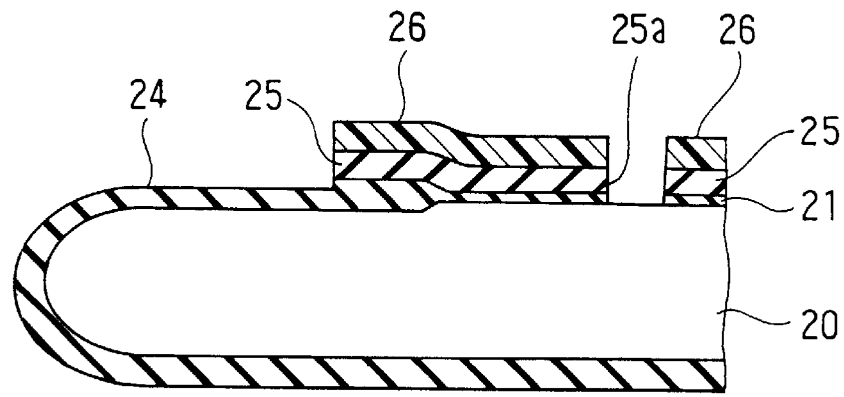

After that, as shown in FIG. 12A, as a second step, by a photolithography process a photoresist 26 serving as a resist material is applied and the photoresist 26 is formed to a predetermined pattern corresponding to regions where trenches are to be formed. At this time, because in the photoresist 26 coating process there is the side rinse process, as described above, a region not coated with photoresist 26 is formed at the periphery of the silicon wafer 20.

Then, as a third step, as shown in FIG. 12A, by dry etching, an opening 25*a* is formed in the oxide film for masking 25 and the pad oxide film 21 in correspondence with the pattern formed in the photoresist 26. At this time, the over-etching condition is set to about 30% with respect to the film thickness (about 1.0 μm) of the oxide film for masking 25. Therefore, at the periphery of the silicon wafer 20 where the photoresist 26 was removed in the above-mentioned side rinse process, after the oxide film for masking 25 is etched off, a part of the oxide film for etching prevention 24 formed underneath is etched.

Figure 12B:
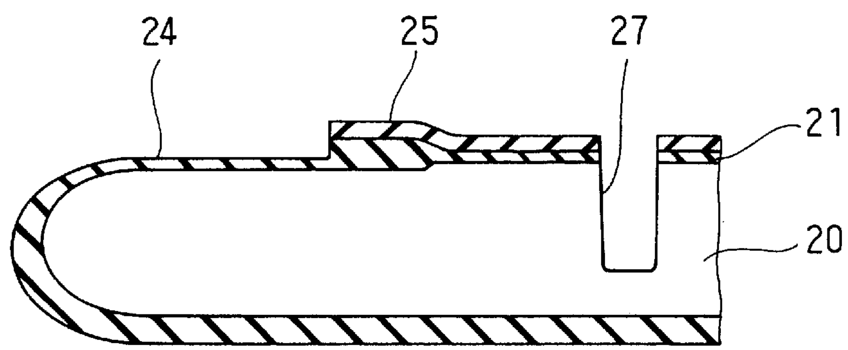

Next, as a fourth step, the photoresist 26 is removed. As a result, the silicon of the silicon wafer 20 becomes exposed in the opening 25*a* with the oxide film for masking 25 serving as a mask. Then, as shown in FIG. 12B, as a fifth step, trench etching is carried out by a reactive ion etching process in the same way as in the first preferred embodiment, and a trench 27 is thereby formed in the silicon wafer 20. At this time, the depth dimension of the trench 27 is made, for example, about 15 μm, the etching selectivity k of the silicon to the oxide film is set to 50 to 200, and therefore, a part of the oxide film for etching prevention 24 at the periphery of the silicon wafer 20 is also etched.

Figure 12C:
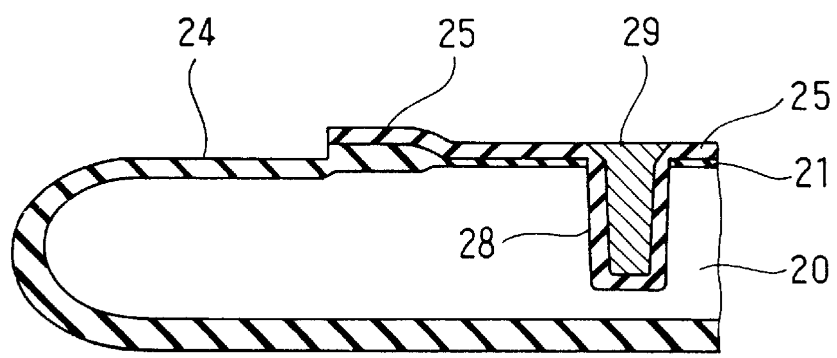

Because the film thickness of this oxide film for etching prevention 24, as in the first preferred embodiment described above, is set so that it remains after the fifth step, silicon of the silicon wafer 20 in a region other than the trench formation region is not etched, and therefore there is no formation of black silicon. As a subsequent step relating to the trench 27 there is a step as shown in FIG. 12C of filling the trench 27 with polysilicon, since this step is the same as in the first preferred embodiment it will not be described here. As a result, an oxide film 28 is formed on the inside walls of the trench 27 and the inside of the trench 27 is filled with polysilicon 29.

Therefore, with this second preferred embodiment as well, it is possible to obtain the same effects as those of the first preferred embodiment.

This invention is not limited to the preferred embodiments described above, and can be modified and extended for example as follows.

The invention can be applied to an ordinary CZ wafer, epi-wafer or embedded epi-wafer, and can be applied to semiconductor wafers other than silicon wafers.

Also, the region where the oxide film for etching prevention is formed is not limited to parts where an oxide film for masking is exposed by side rinsing, and it can also be formed in advance in parts where exposure is anticipated due to other conditions.

Also, as the method for leaving an oxide film to remain on the wafer periphery at the time of trench etching, if resist adhered to the wafer rear side only is removed by backside rinsing and at the time of dry etching to pattern the oxide film for masking a wafer holder whose clamp ring does not make contact with the upper face side of the wafer is used, there is no removal of the oxide film for masking caused by removal of resist from the periphery of the upper surface of the wafer and therefore it becomes possible to utilize this oxide film for masking as an oxide film for etching prevention.

What is claimed is:

1. A method for manufacturing a semiconductor device comprising:

forming a masking insulating film on a main surface of a semiconductor wafer;

coating and patterning a resist material on said masking insulating film;

patterning said masking insulating film to have an opening, by using said resist material as a mask;

removing said resist material on said semiconductor wafer; and forming a trench of a predetermined depth in said opening by dry etching with said masking insulating film as an etching mask, wherein said main surface of said semiconductor wafer, other than a region holding said masking insulating film with said opening thereon, is covered with a preventive insulating film and wherein said preventive insulating film is exposed at a periphery of said main surface of said semiconductor wafer by patterning said masking insulating film.

2. A method for manufacturing a semiconductor device according to claim 1, wherein a film thickness of said preventive insulating film is set to a dimension greater than a total film thickness d (=d1+d2) of a film thickness d1 of a first part of said preventive insulating film that is etched by over-etching after said masking insulating film is etched, and a film thickness d2 of a second part of said preventive insulating film that is etched when said semiconductor wafer is etched to form said trench.

3. A method for manufacturing a semiconductor device according to claim 1, wherein said semiconductor wafer is a semiconductor substrate made by affixing a second semiconductor substrate for device formation to a main surface of a first semiconductor wafer on which said preventive insulating film is formed.

4. A method for manufacturing a semiconductor device according to claim 3, wherein said preventive insulating film is an oxide film selectively made thick at the periphery of said main surface of said first semiconductor substrate.

5. A method for manufacturing a semiconductor device according to claim 1, wherein said preventive insulating film is formed on said semiconductor wafer using LOCOS.

6. A method for manufacturing a semiconductor device according to claim 1, wherein said preventive insulating film is formed on a peripheral part where resist material is removed by side rinsing before patterning said masking insulating film.

7. A method for manufacturing a semiconductor device according to claim 1, wherein a width dimension of said opening formed in said masking insulating film is set at no greater than 10 μm.

8. A method for manufacturing a semiconductor device, comprising:

forming a masking insulating film on a main surface of a semiconductor wafer which holds a preventive insulating film at least at a specific wafer region thereof;

forming a resist material with a resist pattern on said masking insulating film, said resist pattern having a first opening for forming a trench in said semiconductor wafer and a second opening over said specific wafer region;

patterning said masking insulating film using said resist material as a mask into a pattern approximately identical with said resist pattern so that said semiconductor wafer is exposed from said first opening and said preventive insulating film is exposed from said second opening; and forming said trench in said semiconductor wafer through an opening of said masking insulating film corresponding to said first opening of said resist material, by dry etching with said specific wafer region covered with said preventive insulating film.

9. A method for manufacturing a semiconductor wafer according to claim 8, wherein said specific wafer region extends to an entire peripheral part of said main surface of said semiconductor wafer.

10. A method for manufacturing a semiconductor wafer according to claim 8, wherein said semiconductor wafer is exposed only from said opening of said masking insulating film when forming said trench.

11. A method for manufacturing a semiconductor wafer according to claim 8, wherein forming said resist material includes:

disposing a resist film entirely on said main surface of said semiconductor wafer through said masking insulating layer interposed therebetween;

removing a peripheral part of said resist layer extending along a periphery of said semiconductor wafer to form said second opening from which said preventive insulating film is exposed; and forming said first opening from which said masking insulating film is exposed.

12. A method for manufacturing a semiconductor device comprising:

forming a masking insulating film on a main surface of a semiconductor wafer;

coating and patterning a resist material on said masking insulating film;

patterning said masking insulating film to have an opening, by using said resist material as a mask;

removing said resist material on said semiconductor wafer;

forming a trench of a predetermined depth in said opening by dry etching with said masking insulating film as an etching mask, wherein said main surface of said semiconductor wafer, other than a region holding said masking insulating film with said opening thereon, is covered with a preventive insulating film, wherein said preventive insulating film is formed on said semiconductor wafer using LOCOS.

13. A method for manufacturing a semiconductor device according to claim 12, wherein said preventive insulating film is formed on a peripheral part where resist material is removed by side rinsing before patterning said masking insulating film.

14. A method for manufacturing a semiconductor device according to claim 12, wherein a width dimension of said opening formed in said masking insulating film is set at no greater than 10 μm.

15. A method for manufacturing a semiconductor device according to claim 12, wherein said preventive insulating film is exposed at a periphery of said main surface of said semiconductor wafer by patterning said masking insulating film.

* * * * *